(12) United States Patent
Fox et al.

(10) Patent No.: US 7,472,337 B2
(45) Date of Patent: Dec. 30, 2008

(54) METHOD AND SYSTEM FOR DETECTING FAULTS IN AN ELECTRONIC ENGINE CONTROL MODULE

(75) Inventors: Richard S. Fox, Columbus, IN (US); John D. Acton, Columbus, IN (US); Glenda R. Henry, Columbus, IN (US); Charlie D. Wilson, Columbus, IN (US); Steve Ferree, Columbus, IN (US)

(73) Assignee: Cummins, Inc., Columbus, IN (US)

( * ) Notice: Subject to any disclaimer, the term of this patent is extended or adjusted under 35 U.S.C. 154(b) by 677 days.

(21) Appl. No.: 11/085,874

(22) Filed: Mar. 22, 2005

(65) Prior Publication Data

US 2006/0218443 A1    Sep. 28, 2006

(51) Int. Cl.
G06F 11/00 (2006.01)
G08C 25/00 (2006.01)
H04L 1/00 (2006.01)
H03M 13/00 (2006.01)

(52) U.S. Cl. .................. 714/799; 324/503; 370/242; 702/58

(58) Field of Classification Search .............. 714/799, 714/25; 324/503; 340/3.43; 370/242; 702/58
See application file for complete search history.

(56) References Cited

U.S. PATENT DOCUMENTS

| | | | | |
|---|---|---|---|---|
| 4,521,848 A | * | 6/1985 | Bruce et al. | 714/43 |
| 4,631,479 A | * | 12/1986 | Haga | 324/212 |
| 4,715,034 A | * | 12/1987 | Jacobson | 714/719 |
| 4,903,321 A | * | 2/1990 | Hall et al. | 455/515 |
| 5,107,427 A | | 4/1992 | Peter et al. | |
| 5,388,045 A | | 2/1995 | Kamiya et al. | |
| 5,706,199 A | * | 1/1998 | Wilson et al. | 701/93 |
| 5,847,644 A | * | 12/1998 | Weisman et al. | 340/439 |
| 5,966,676 A | | 10/1999 | Fujiwara et al. | |
| 5,987,365 A | | 11/1999 | Okamoto | |
| 6,122,574 A | | 9/2000 | Ohtsu et al. | |
| 6,347,267 B1 | | 2/2002 | Murakami | |
| 6,389,335 B1 | | 5/2002 | Vos | |
| 6,447,453 B1 | | 9/2002 | Roundhill et al. | |
| 6,502,018 B1 | | 12/2002 | Bessler | |
| 6,556,900 B1 | | 4/2003 | Brynielsson | |
| 6,574,537 B2 | | 6/2003 | Kipersztok et al. | |
| 6,594,563 B1 | | 7/2003 | Ding | |
| 6,646,397 B1 | | 11/2003 | Discenzo | |
| 6,654,648 B2 | | 11/2003 | Nada et al. | |
| 2001/0041955 A1 | | 11/2001 | Nada | |
| 2002/0059020 A1 | | 5/2002 | Abe et al. | |
| 2002/0116114 A1 | | 8/2002 | Little | |
| 2003/0040856 A1 | | 2/2003 | Winner et al. | |
| 2003/0060951 A1 | | 3/2003 | Mayer et al. | |
| 2003/0074116 A1 | | 4/2003 | Winner et al. | |
| 2003/0158639 A1 | | 8/2003 | Nada | |
| 2007/0055421 A1 | * | 3/2007 | Bauerle et al. | 701/29 |

\* cited by examiner

Primary Examiner—M. Mujtaba K Chaudry
(74) Attorney, Agent, or Firm—Baker & Daniels LLP

(57) ABSTRACT

An algorithm for detecting a fault in an ECM output signal by determining a status of the output signal, incrementing an error timer and a retry timer when the status is abnormal, incrementing a retry counter when the retry timer reaches a maximum retry time, and reporting an intermittent fault if the retry counter reaches a retry limit before the error timer reaches an error timer maximum.

29 Claims, 6 Drawing Sheets

METHOD AND SYSTEM FOR DETECTING FAULTS IN AN ELECTRONIC ENGINE CONTROL MODULE

FIELD OF THE INVENTION

The present invention generally relates to fault detection systems and methods, and more particularly to an algorithm for detecting intermittent faults in an electronic engine control module ("ECM").

BACKGROUND OF THE INVENTION

For many years, various types of internal combustion engines have included an ECM, which controls the engine using electronics and software instead of analog or mechanical methods. In general, the ECM receives from sensors and other circuits a variety of signals indicating, for example, the status, temperature, pressure, speed, etc. of different components of the engine. The ECM uses this information to provide appropriate control signals to, for example, solenoids, exhaust gas recirculating valves, air intake systems, fans, and engine fuel injectors.

The harsh environment of the engine and other conditions may result in component malfunctions, errors, and other failure modes (collectively, "faults"). Some of these faults are constant (e.g., a broken wire), and others are intermittent (e.g., a wire that periodically shorts to ground as a result of engine vibration). When a fault is present at an output of the ECM, such as when the ECM is attempting to drive a channel high, but the output for that channel remains low, the fault can be detected and reported by the ECM. Conventional ECMs, however, do not distinguish between constant faults and intermittent faults. Accordingly, service technicians may spend additional time troubleshooting an engine to determine the source of the fault. This may result in higher operations costs as a consequence of additional down-time and service fees. In some situations, the service technician may erroneously replace an ECM, whereas if the service technician knew the fault was intermittent, then the service technician may have been able to isolate the fault and identify its actual source. Clearly, the situation in which an ECM is replaced when the actual source of the fault is elsewhere on the engine is undesirable.

SUMMARY OF THE INVENTION

The present invention provides an algorithm for detecting a fault in an output signal, including the steps of determining the status of the output signal, incrementing an error timer when the output signal status is abnormal, incrementing a retry timer when the output signal status is abnormal, incrementing a retry counter when the retry timer reaches a maximum retry time, and reporting an intermittent fault if the retry counter reaches a retry limit before the error timer reaches an error timer maximum. In one embodiment of the invention, the output signal is a signal output from an electronic ECM, and the algorithm is embodied in software that operates on the ECM.

More specifically, the algorithm may access the status of a particular output signal of the ECM, indicates an abnormal status of the output signal, and performs a series of retry attempts to cause the output signal to assume a normal status. During each attempt, the algorithm reconfigures the output signal with a diagnostic value, increments a retry counter, and increments or decrements (depending upon the status of the output signal) an error timer during a delay period.

If the fault persists, then the error timer will reach a predetermined maximum value before the retry counter reaches a maximum value (i.e., before the maximum number of retry attempts is performed). When this constant fault condition occurs, the algorithm reports an error (corresponding to a constant fault of a particular state) to the ECM's diagnostic system. If, on the other hand, the fault is intermittent, then the error timer will be incremented some of the time and decremented some of the time. As a result, the error timer may not reach its maximum value before the retry counter reaches its maximum value. In this situation, in which the fault condition is set because the retry maximum is reached, the algorithm reports a different error (corresponding to an intermittent fault of a particular state) to the ECM's diagnostic system.

The features and advantages of the present invention described above, as well as additional features and advantages, will be readily apparent to those skilled in the art upon reference to the following description and the accompanying drawings.

DETAILED DESCRIPTION OF EMBODIMENTS OF THE INVENTION

The embodiments described below are merely exemplary and are not intended to limit the invention to the precise forms disclosed. Instead, the embodiments were selected for description to enable one of ordinary skill in the art to practice the invention.

Figure 1:
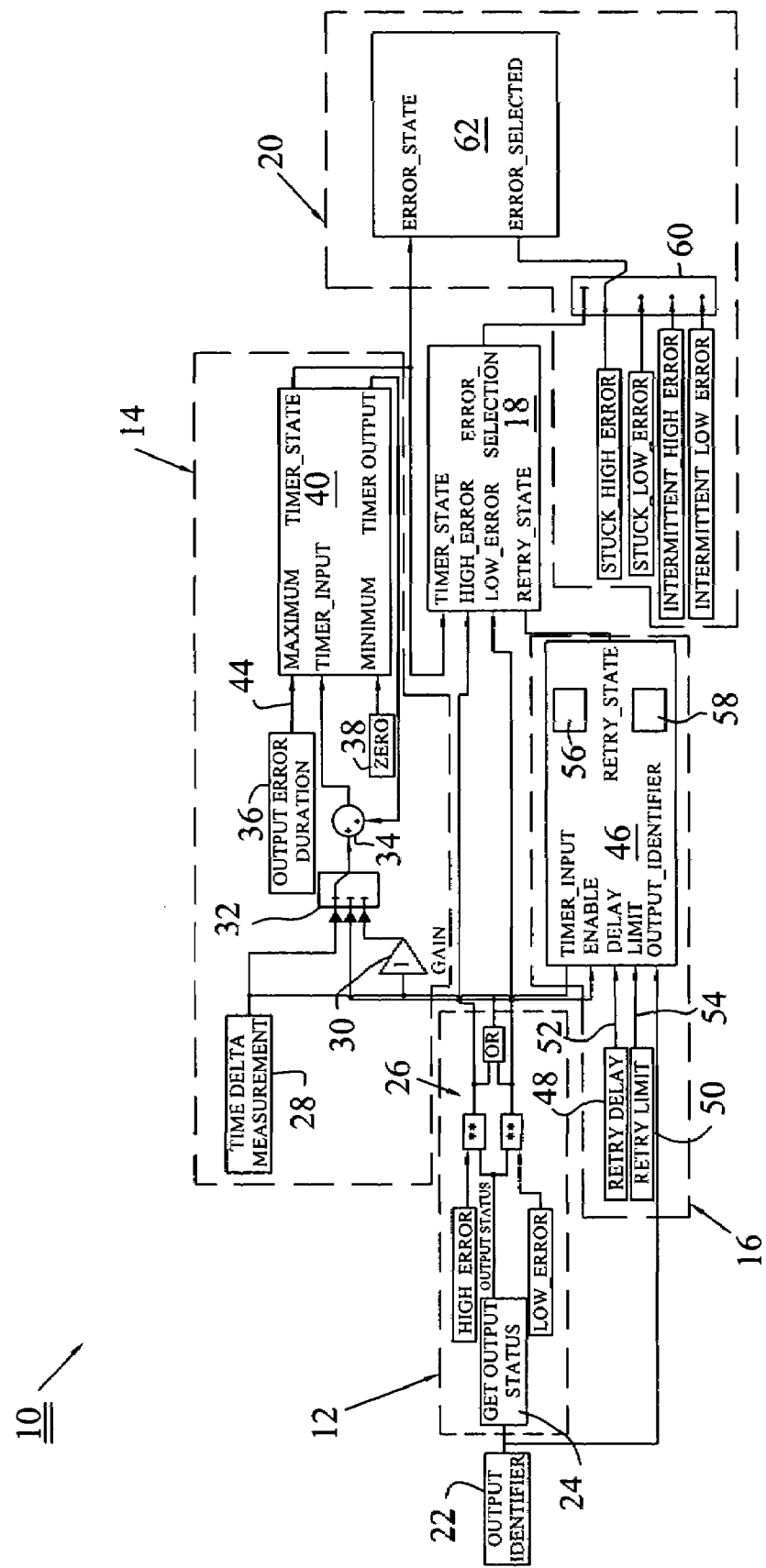
FIG. 1 is functional block diagram of a software scheme for implementing an algorithm according to one embodiment of the invention.

Referring now to the block diagram of FIG. 1, it should be understood that the components depicted may represent software modules which produce source code that is downloaded to the ECM. Alternatively, the components may represent hardware, or a combination of hardware and software, that is configured to execute the functions described herein. For purposes of this description, many of the components are simply referred to as blocks.

The software scheme 10 of FIG. 1 generally includes an error detection block 12, an error timer block 14, a retry control block 16, an error identification block 18, and an error reporting block 20. Error detection block 12 receives output identifier input 22, which simply specifies which of a plurality of output channels controlled by the ECM is monitored by scheme 10. Given the selection of a monitored channel, the output status block 24 of error detection block 12 obtains from the operating system the status of the output signal corresponding to the monitored channel. Error detection block 12 provides a particular output to error timer block 14 and retry control block 16 when an abnormal condition in the monitored output channel is detected. As indicated generally by reference numeral 26, logic within error detection block 12 generates a high or a low output, depending upon the status of the monitored output signal. More particularly, when the output signal is either unexpectedly high or unexpectedly low, error detection block 12 outputs a logic one, in this example, to error timer block 14 and retry control block 16. Otherwise, the output of error detection block 12 is a logic zero. It should be understood, however, that a reverse polarity may readily be implemented. It should also be understood that instead of detecting unexpected logic states of the monitored output signal, error detection block 12 may instead detect in-range versus out-of-range output signals, or any other output signal condition that may indicate a fault.

Error timer block 14 includes a time delta measurement input 28, an inverter 30, a switch 32, a summer 34, an output error duration input 36, a zero input 38, and an error timer processor block 40. Time delta measurement input 28 is a variable programmed in to software scheme 10 that represents the elapsed time since the previous status check of the monitored output signal. Typically, time delta measurement input 28 is set to equal the time required for one execution cycle of scheme 10. During the time corresponding to time delta measurement input 28, time delta measurement input 28 provides a first output signal and a second, inverted output signal (via inverter 30) to switch 32. Time delta measurement input 28 also provides a timer input signal to retry control block 16. As is further described below, depending upon the level of the output of error detection block 12, switch 32 is configured to pass either the first output signal or the second output signal from time delta measurement input 28 to summer 34. Thus, under one set of conditions, the output of summer 34 (hereinafter, "error timer 42") increments during the time corresponding to time delta measurement input 28. Under another set of conditions, error timer 42 decrements during this time. It should be understood that the gain of the adjustment to error timer 42 may be adjustable. For example, in one embodiment of scheme 10, each increment to error timer 42 may result in an increase of error timer 42 by a unit of one, while each decrement only results in a decrease of error timer 42 by a unit of one-half. For purposes of this description, it is assumed that the increments and decrements are of equal value.

Output error duration input 36 is another input variable to scheme 10 which establishes the maximum permissible value of error timer 42. This maximum value (hereinafter, "error timer maximum 44") is determined with reference to the service requirements and other characteristics of the hardware being monitored (i.e., the hardware associated with the monitored output signal). Error timer maximum 44 and zero input 38 are provided as inputs to error timer processor block 40. As is further described below, the timer state output of error timer processor block 40 indicates when error timer 42 has reached error timer maximum 44. The timer output of error timer processor block 40 provides the current value of error timer 42 as feedback to summer 34 as shown.

Retry control block 16 generally includes a retry processor 46, which receives as inputs output identifier input 22, a retry delay input 48, a retry limit input 50, and time delta measurement input 28. Retry delay input 48 provides the delay time required between retry attempts to avoid damage to equipment or other undesirable consequences of enabling a faulty output (hereinafter, "maximum retry time 52"). For example, if the monitored output of the ECM is a control signal that is configured to cause application of 12 volts to an engine component, but the connection to the component is shorted to ground, then it is undesirable to enable the monitored output for a lengthy period of time. Similarly, retry limit input 50 provides the maximum number of retry attempts permitted during the process of identifying a fault condition (hereinafter, "retry limit 54").

As shown in FIG. 1, retry processor 46 includes a retry timer 56 and a retry counter 58. Retry timer 56 is enabled whenever the output of error detection block 12 indicates an abnormal status of the monitored output signal. When enabled, retry timer 56 increases in value until it reaches maximum retry time 52. When retry timer 56 reaches maximum retry time 52, retry timer 56 is reset to zero as is further described below. Retry counter 58 is incremented each time retry timer 56 reaches maximum retry time 52. Whenever retry counter 58 is incremented, the monitored output signal is reconfigured with a diagnostic value by retry processor 46 and re-enabled. Again, as is more fully described in the discussion of the operation of scheme 10, this reconfiguration is intended to cause the monitored output signal to assume a normal status. If a fault is associated with the monitored output signal, then retry counter 58 may reach retry limit 54. When that occurs, retry processor 46 indicates to error identification block 18 on the retry state output signal that the maximum number of retry attempts has been reached.

Error identification block 18 includes logic that identifies the type of fault exhibited by the monitored output signal. More specifically, if the output of error timer block 14 indicates that error timer 42 has reached error timer maximum 44 before the output of retry control block 16 indicates that retry counter 58 has reached retry limit 54, then error identification block 18 generates an error selection output corresponding to a constant fault. Error identification block 18 determines the type of constant fault to generate (i.e., stuck high or stuck low) based on the high error and low error inputs from error detection block 12. On the other hand, if retry counter 58 reaches retry limit 54 before error timer 42 reaches error timer maximum 44, then error identification block 18 generates an error selection output corresponding to an intermittent fault (i.e., intermittent high or intermittent low, depending upon the inputs from error detection block 12).

Error reporting block 20 includes a fault selector switch 60 and a fault output block 62. Fault selector switch 60 sets one of the four fault types (i.e., stuck high, stuck low, intermittent high, or intermittent low) corresponding to the output of error identification block 18. Fault selector switch 60 then provides the selected fault type to fault output block 62. When the timer state output of error timer block 14 indicates that error timer 42 has reached error timer maximum 44, fault output block 62 reports the fault type to, for example, the diagnostic equipment (not shown) operated by a service technician. As will be further described below, scheme 10 permits error timer 42 to reach error timer maximum 44, regardless of whether the detected fault is intermittent or constant.

Figure 2:
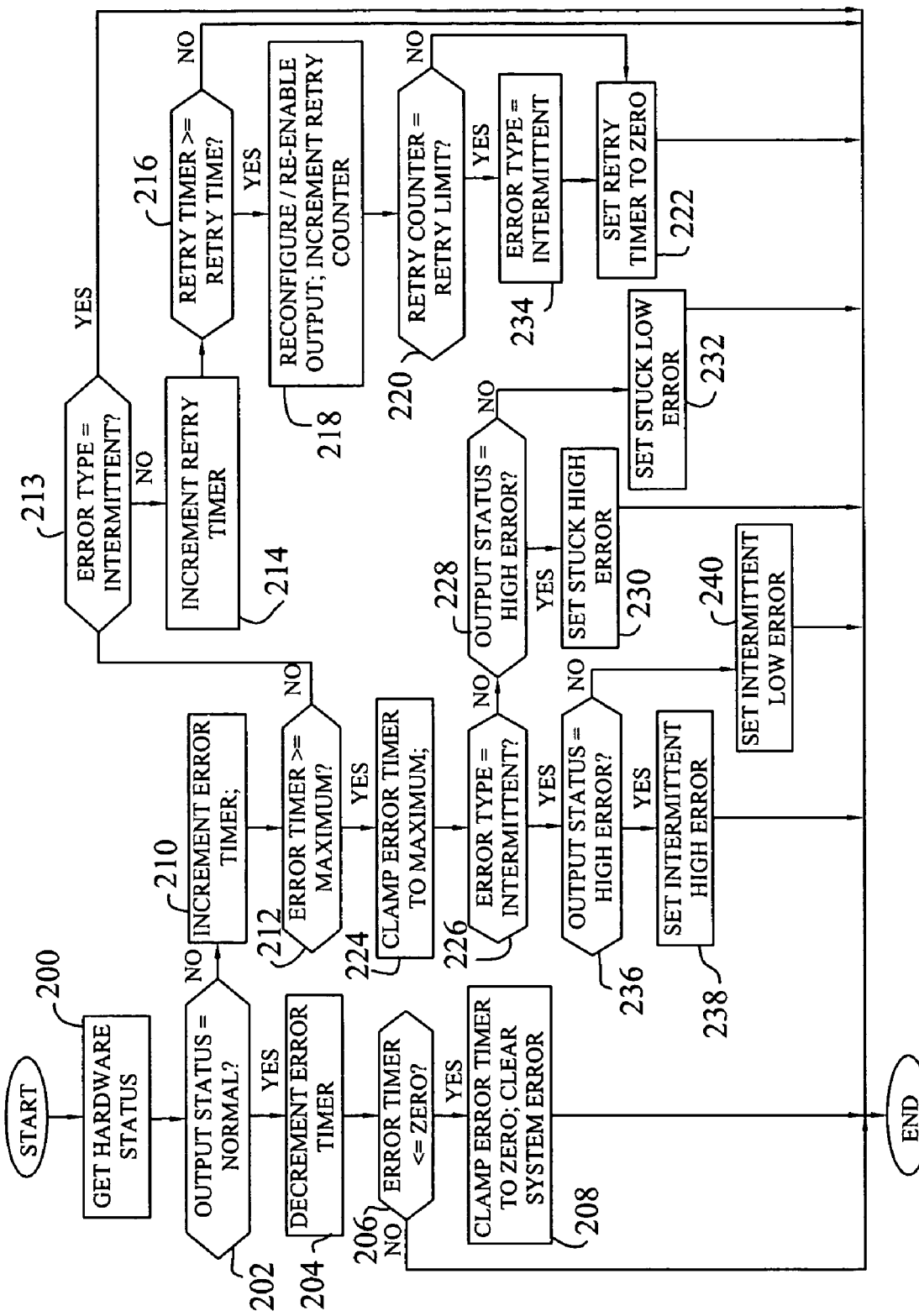
FIG. 2 is a flow chart depicting steps performed during operation of the software scheme of FIG. 1.

Referring now to FIG. 2, the operation of one embodiment of the present invention is depicted in flow chart form. As explained above, during operation of the engine, the ECM provides a variety of output signals to different engine components. The algorithm corresponding to the software scheme 10 of FIG. 1 monitors at least one of those output signals as represented by block 200 (and identified by output identifier input 22). At decision block 202 (corresponding to output status block 24), the algorithm determines whether the output signal status is normal. For example, if the output signal is expected to be high under the current operating circumstances but is low, then the result of decision block 202 is "No." The progression of steps under these abnormal circumstances is described in detail in a later section.

When a fault is not present (i.e., under normal circumstances), the output signal status corresponds to the expected status, and the result of decision block 202 is "Yes." In this case, error timer block 14 decrements error timer 42 at block 204. As error timer 42 is initially set at zero, the decremented error timer 42 has a value that is less than zero. Consequently, the result of decision block 206 is "Yes." At block 208, error timer 42 is clamped to zero and any system error associated with the output signal is cleared. In this example, no such error was previously set.

During the next monitoring cycle of normal operation, the algorithm steps through the same sequence of steps. More specifically, after obtaining the status of the output signal (block 200) and determining that the status is normal (block 202), error timer 42 (which was previously clamped to zero) is decremented (block 204) and determined to be less than zero (block 206). Error timer 42 is again clamped to zero (block 208) and the process is repeated periodically until an abnormal output status is detected at decision block 202, as is described in detail below.

When an abnormal output status is detected at decision block 202, error timer block 14 increments error timer 42 at block 210. For purposes of explanation, it is first assumed that a "hard" or constant fault is associated with the monitored output signal. Later, the process for identifying the presence of an intermittent fault is described. After error timer processor block 40 increments error timer 42 at block 210, it compares the current value of error timer 42 at decision block 212 to error timer maximum 44, which is determined as described above. Initially, the value of error timer 42 is not greater than or equal to error timer maximum 44, and flow of the algorithm proceeds to decision block 213. At decision block 213, the algorithm determines whether an intermittent error has been previously identified. Here, the result is "No." At block 214, retry processor 46, which is enabled by the output of error detection block 12, increments retry timer 56 from its initial value (typically zero). At decision block 216, retry processor 46 compares the current value of retry timer 56 to maximum retry time 52, which corresponds to the maximum time permitted for each retry attempt as described above. Initially, the value of retry timer 56 is not greater than or equal to maximum retry time 52, and the result of decision block 216 is "No." Consequently, the status of the output signal (obtained at block 200) is again assessed at decision block 202 during the next cycle.

In this example of a constant fault, the algorithm again determines that the output signal status is abnormal (block 202), increments error timer 42 (block 210), compares the current value of error timer 42 to error timer maximum 44 (block 212), determines whether an intermittent error has been previously identified (block 213), increments retry timer 56 (block 214), and compares retry timer 56 to maximum retry time 52 (block 216). In one embodiment of the algorithm of the present invention, the time required for error timer 42 to reach error timer maximum 44 exceeds maximum retry time 52. It should be understood, however, that these time parameters may be configured such that error timer 42 reaches error timer maximum 44 before retry timer 56 reaches maximum retry time 52. In the presently described embodiment, because more than one retry attempt is required to establish a constant fault, retry timer 56 reaches maximum retry time 52 before error timer 42 reaches error timer maximum 44. Thus, the algorithm cycles through the above-described loop until the result of decision block 216 is "Yes," and control is transferred to block 218.

At block 218, retry processor 46 reconfigures and re-enables the monitored output signal in an attempt to produce a normal status. Additionally, retry processor 46 increments retry counter 58. At decision block 220, retry processor 46 determines whether retry counter 58 has reached retry limit 54 (i.e., the maximum number of retry attempts permitted before setting a system error). In this example, retry counter 58 does not equal retry limit 54, and retry processor 46 resets retry timer 56 to zero at block 222.

During the next retry attempt in this constant fault example, the output status is again abnormal (decision block 202), and error timer block 14 further increments error timer 42 (block 210). At decision block 212, error timer processor block 40 again compares the current value of error timer 42 to error timer maximum 44. Assuming that error timer 42 does not reach error timer maximum 44 until some portion of the second retry attempt is completed, the result of decision block 212 is initially "No." Thus, after determining that no intermittent fault has been previously identified (decision block 213), retry processor 46 increments retry timer 56 (block 214) and compares retry timer 56 to maximum retry time 52 (decision block 216). During the initial portion of the second retry attempt, retry timer 56 does not equal or exceed maximum retry time 52. Consequently, the result of decision block 216 is "No," and the algorithm loops back to block 200. In this example, the above-described loop continues until the constant fault causes error timer 42 to reach error timer maximum 44.

When error timer 42 reaches error timer maximum 44, the result of decision block 212 is "Yes," and error timer processor block 40 clamps error timer 42 to error timer maximum 44 at block 224. At decision block 226, the algorithm determines whether the error type has been identified as intermittent (as is described below). In this example, the result of decision block 226 is "No," and control is passed to decision block 228. At decision block 228, error identification block 18 of FIG. 1 determines whether the output status corresponds to a high error by accessing output status block 24. As explained above, a high error exists when the expected output signal is low, but the actual output signal is high. The converse represents a low error. If the output status indicates a high error, then error identification block 18 causes fault selector switch 60 to indicate a "stuck high error" at block 230. If, on the other hand, the output status does not indicate a high error, then error identification block 18 causes fault selector switch 60 to indicate a "stuck low error" at block 232. In either event, fault selection switch 60 provides the fault type information to fault output block 62, which reports the fault to, for example, the technician troubleshooting the system after error timer processor block 40 indicates that error timer 42 has reached error timer maximum 44. Although this reporting step is not explicitly shown in FIG. 2, it occurs as part of the set error blocks 230, 232, 238, and 240. After the fault is reported, normal operation of the system is altered to accommodate the constant fault.

For clarity, the following description of the operation of the present algorithm under an intermittent fault condition does not refer back to most of the components of FIG. 1. Instead, only the processing steps of the flow chart of FIG. 2 are described as they relate to error timer 42, retry timer 56 and retry counter 58, and the maximum values associated with those variables. At block 200, the algorithm determines the status of the monitored output signal. Assuming the status is abnormal during the first cycle, the result of decision block 202 is "No," and error timer 42 is incremented at block 210. As error timer 42 has not yet reached error timer maximum 44 and an intermittent failure has not yet been identified, the results of decision blocks 212 and 213 are "No." Thus, the algorithm increments retry timer 56 at block 214 and compares retry timer 56 to maximum retry time 52 at decision block 216. During this first cycle, retry time 56 does not equal or exceed maximum retry time 52, and the result of decision block 216 is "No."

During the next cycle, the status of the monitored output signal is still abnormal. Accordingly, error timer 42 is incremented (but still does not equal or exceed error timer maximum 44) and retry timer 56 is incremented such that it equals maximum retry time 52. Thus, the result of decision block 216 is "Yes," and the algorithm reconfigures and re-enables the monitored output signal at block 218. The algorithm also increments retry counter 58 at block 218, but retry counter 58 does not yet equal or exceed retry limit 54. Thus, the result of decision block 220 is "No," and retry timer 56 is reset to zero (block 222).

If, during the next cycle, the status of the monitored output signal is normal, error timer 42 is decremented at block 204 and another cycle is begun. As should be apparent from the foregoing, when an intermittent fault exists, error timer 42 may be periodically decremented to a non-zero value as a result of a normal output signal status. Consequently, additional retry attempts may be required to determine the type of error. During these additional retry attempts, the algorithm may increment and decrement error timer 42 (depending upon the status of the monitored output signal), and periodically increment retry timer 56 to exceed maximum retry time 52, which increments retry counter 58 toward retry limit 54. If the intermittent error persists for a sufficient period of time, then retry counter 58 will reach retry limit 54. When this occurs, the result of decision block 220 is "Yes," and an intermittent error is identified. At block 222, the algorithm resets retry timer 56 to zero and begins another cycle.

If the monitored output signal status remains abnormal during the next cycle, then the algorithm increments error timer 42 at block 210 and compares error timer 42 to error timer maximum at decision block 212. Otherwise, the algorithm decrements error timer 42 at block 204 and compares error timer 42 to zero at decision block 206. If error timer 42 is incremented at block 210, but does not yet equal or exceed error timer maximum 44, then the result of decision block 212 is "No." At decision block 213, the algorithm determines that an intermittent error has been identified and begins another cycle. As should be apparent from the foregoing, the algorithm continuously increments error timer 42 and compares error timer 42 to error timer maximum 44 as long as the monitored output signal status remains abnormal. It should be further understood that the output signal status should remain abnormal as no further reconfiguring and re-enabling of the output signal will occur. Consequently, the result of decision block 212 will eventually be "Yes." At block 224, the algorithm clamps error timer 42 to error timer maximum 44. At decision block 226, the algorithm determines whether an intermittent error was previously identified. In this example, the result of decision block 226 is "Yes." Thus, at decision block 236, the algorithm determines whether the status of the monitored output signal is high. If it is, then the algorithm identifies an intermittent high fault and reports the fault in the manner described above. If not, then the algorithm identifies an intermittent low fault and reports the fault in the manner described above.

Figure 3A:
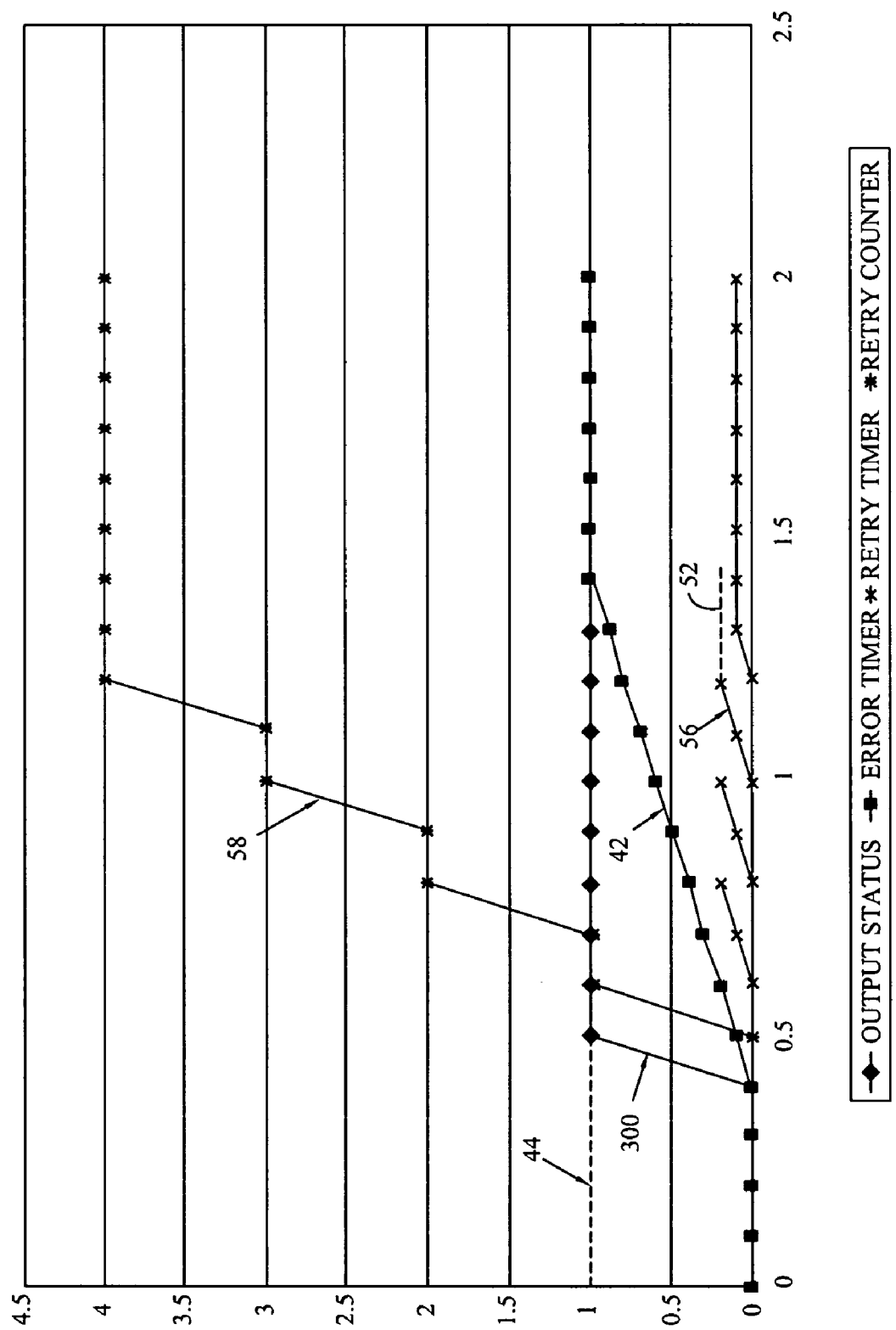
FIGS. 3A and 3B are graphs depicting certain parameters associated with operation of the software scheme of FIG. 1 under a constant fault condition.

FIG. 3A is a graphical depiction of several variables of the present algorithm as the variables change over time during identification of a constant fault. The x-axis represents time in arbitrary units. Each minor division of the x-axis represents one cycle of operation of the present algorithm. The y-axis represents status, counts, or time, depending upon the plotted variable as is further described below. In general, this graph illustrates multiple retry attempts (represented by retry counter 58) wherein the monitored output signal status (output status trace 300) remains abnormal (beginning at time 0.5) and error timer 42 continuously increments to error timer maximum 44 (in this example, a value of 1.0). During this time, retry timer 56 is incremented several times to maximum retry time 52 (in this example, a value of 0.2). As shown, although the algorithm increments retry counter 58 several times during the depicted period of operation, retry counter 58 does not reach retry limit 54 (in this example, a value of 10 as shown in FIG. 4A) before error timer 42 reaches error timer maximum 44. A detailed explanation of the manner in which the present algorithm identifies a constant fault is provided below with reference to FIG. 3B (an enlarged version of portions of FIG. 3A) and the flow chart of FIG. 2.

Figure 3B:
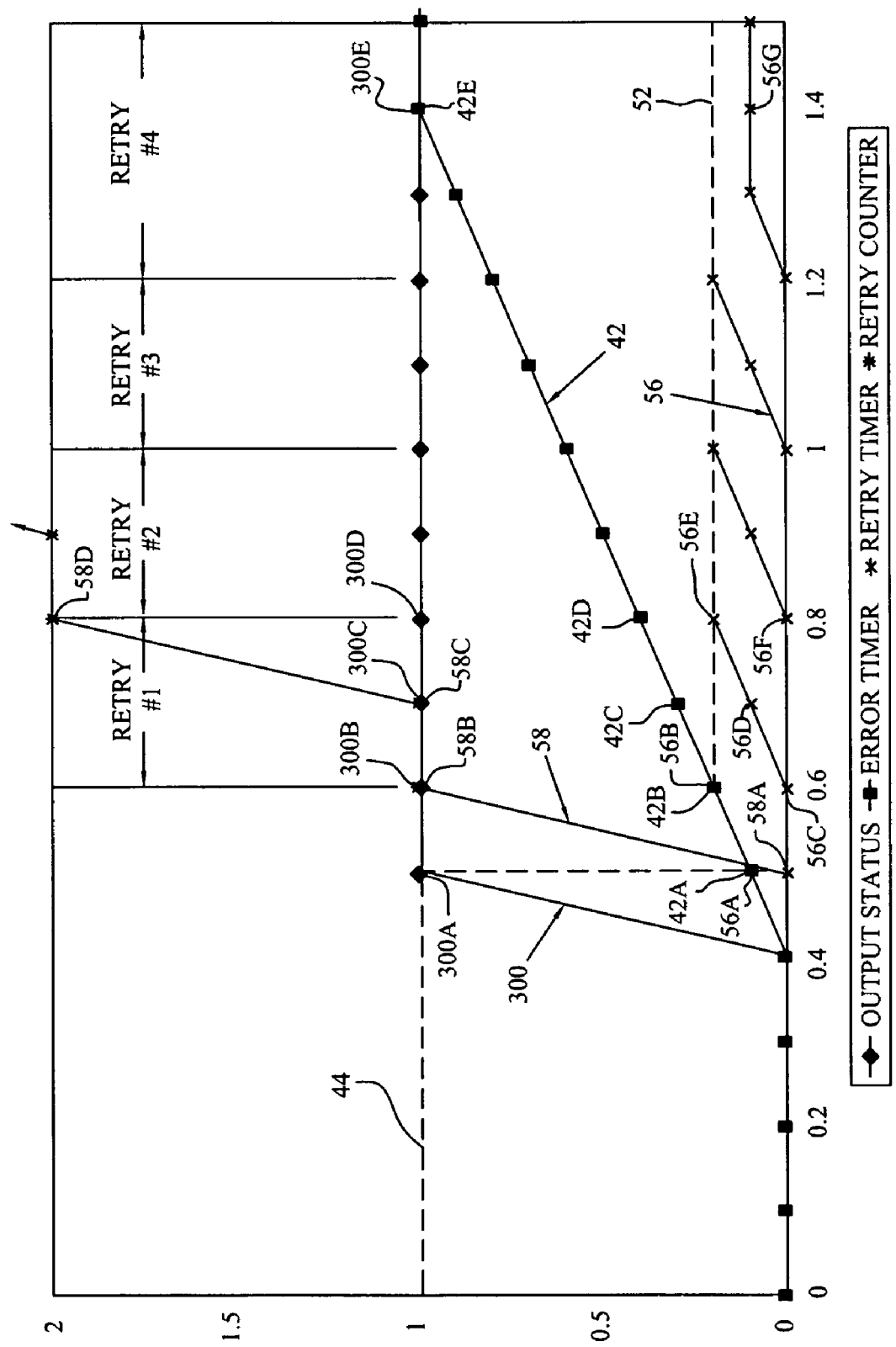
Figure 4A:
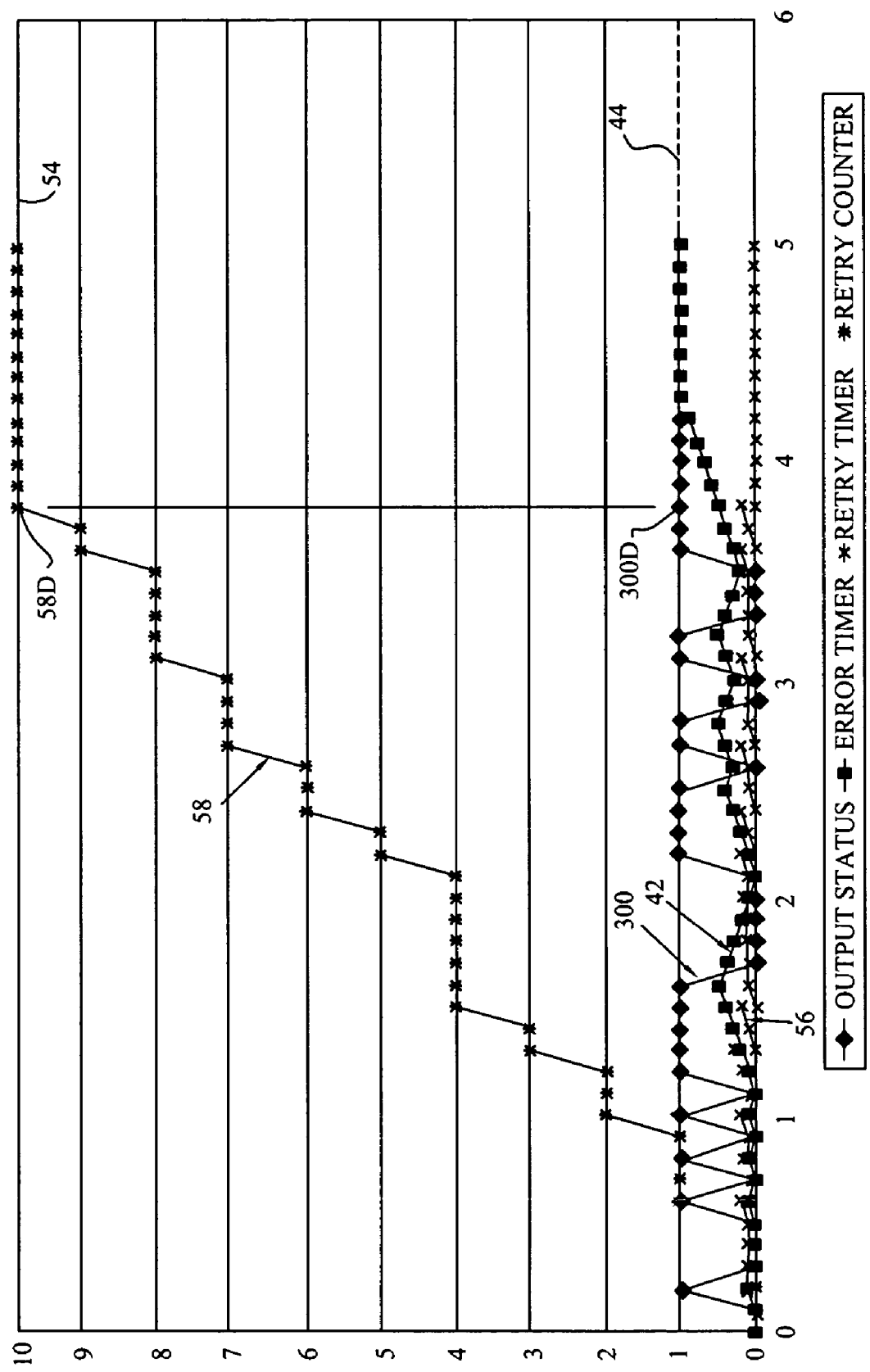
FIGS. 4A and 4B are graphs depicting certain parameters associated with operation of the software scheme of FIG. 1 under an intermittent fault condition.

As shown in FIG. 3B, during the first four cycles of operation, output status trace 300 indicates that the output status of the monitored output signal is normal (i.e., has an expected value). This normal status is represented by the value of zero. At a time of 0.5, output status trace 300 indicates an abnormal output signal status (data point 300A). Thus, the result of decision block 202 of FIG. 2 is "No," and error timer 42 is incremented at block 210 (data point 42A in FIG. 3B). As error timer 42 has not yet reached error timer maximum 44 and an intermittent error has not yet been identified, the results of decision blocks 212 and 213 of FIG. 2 are "No." At block 214, retry timer 56 is incremented as represented by data point 56A (on top of data point 42A). As retry timer 56 has not yet reached maximum retry time 52, the result of decision block 216 is "No," and the algorithm increments retry counter 58 as depicted by data point 58A. The algorithm then loops back to block 200.

During the next cycle, as output status trace 300 still indicates an abnormal output status (data point 300B), the result of decision block 202 is again "No," and the algorithm increments error timer 42 (data point 42B) at block 210. Again, error timer 42 has not yet reached error timer maximum 44 and an intermittent error has not been identified. Accordingly, the algorithm increments retry timer 56 at block 214 (data point 56B; on top of data point 42B). As retry timer 56 has reached maximum retry time 52 (i.e., a value of 0.2 in this example), the result of decision block 216 is "Yes." Accordingly, the algorithm reconfigures and re-enables the output signal at block 218, and increments retry counter 58 (data point 58B, on top of data point 300B). After this first increment of retry counter 58, it has not yet reached retry limit 54. Thus, the result of decision block 220 is "No," and the algorithm re-sets retry timer 56 to zero (data point 56C). Again, the algorithm loops back to block 200.

During the next cycle, output status trace 300 indicates an abnormal status (data point 300C). Accordingly, the result of decision block 202 is again "No," and the algorithm increments error timer 42 (data point 42C) at block 210. Again, error timer 42 has not yet reached error timer maximum 44 and an intermittent error has not been identified. Accordingly, the algorithm increments retry timer 56 at block 214 (data point 56D), but retry timer 56 does not equal or exceed maximum retry time 52. Thus, the result of decision block 216 is "No," retry counter 58 remains unchanged (data point 58C; on top of data point 300C), and the algorithm initiates another cycle.

During the next cycle, output status trace 300 again indicates an abnormal status (data point 300D), which causes the algorithm to increment error timer 42 (data point 42D) and retry timer 56 (data point 56E). As retry timer 56 has reached maximum retry time 52, the algorithm reconfigures and re-enables the output signal at block 218, increments retry counter 58 (data point 58D), and re-sets retry timer 56 to zero (data point 56F). During a constant fault situation, the algorithm repeats the steps of the above-described retry attempt until error timer 42 reaches error timer maximum 44.

During the last cycle depicted in FIG. 3B, output error status trace 300 indicates an abnormal status (data point 300E), which causes the algorithm to increment error timer 42 at block 210 (data point 42E; on top of data point 300E). At decision block 212 of FIG. 2, the algorithm determines that error timer 42 has reached error timer maximum 44. At block 224, the algorithm clamps error timer 42 to error timer maximum 44. As no intermittent error has been identified, the result of decision block 226 is "No." It should be noted that retry time 56 is not incremented from its previous value as indicated by data point 56G. At decision block 228, the algorithm determines whether a high or a low error is present. Depending upon the type of constant error associated with the monitored output signal, a stuck high error or a stuck low error is set and reported in the manner described above.

FIG. 4A is a graphical depiction of several variables of the present algorithm as the variables change over time during identification of an intermittent fault. In general, FIG. 4A illustrates retry counter 58 as it is incremented to retry limit 54 (in this example, a value of 10) while error timer 42 remains below error timer maximum 44 (in this example, a value of 1.0). As is described in detail below, the algorithm increments retry counter 58 to retry limit 54 because error status trace 300 alternates intermittently between a normal status (in this example, a value of zero) and an abnormal status (in this example, a value of 1.0) in a manner that prevents error timer 42 from reaching error timer maximum 44 before retry counter 58 reaches retry limit 54.

Figure 4B:
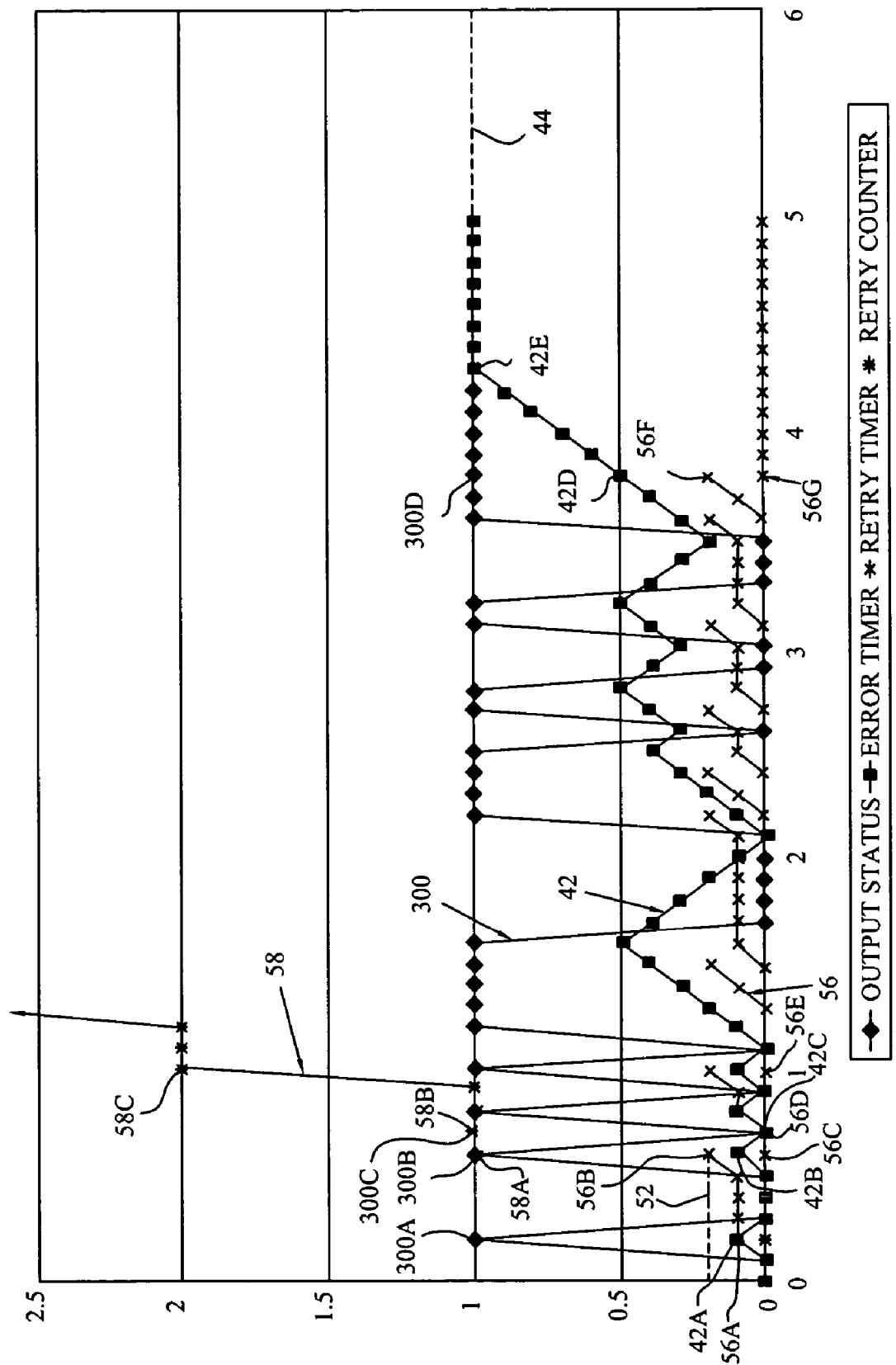

For clarity, reference is now made to FIG. 4B which is an enlarged view of portions of FIG. 4A. As shown, error status trace 300 indicates a normal status of the monitored output signal during the first two cycles. During the third cycle, error status trace 300 indicates an abnormal status (data point 300A). Thus, the result of decision block 202 (FIG. 2) is "No," and the algorithm increments error timer 42 at block 210 (data point 42A). As error timer 42 is not equal to or greater than error timer maximum 44 and no intermittent error has been identified, the results of decision blocks 212 and 213 are "No," and retry timer 56 is incremented at block 214 (data point 56A; on top of data point 42A). As retry timer 56 does not equal or exceed maximum retry time 52 (in this example, a value of 0.2), the result of decision block 216 is "No," and another cycle begins.

During the next few cycles, error status trace 300 indicates a normal status, which causes the algorithm to decrement error timer 42 back to zero and maintain retry timer 56 at its present level. As shown in FIG. 4A, retry counter 58 remains at a level of zero during the above-described initial period of this example. At data point 300B, however, error status trace 300 again indicates an abnormal status, causing the algorithm to increment error timer 42 (data point 42B) at block 210, and retry timer 56 (data point 56B) at block 214. During this cycle, retry timer 56 reaches maximum retry time 52, and the result of decision block 216 is "Yes." Consequently, the algorithm reconfigures and re-enables the monitored output signal and increments retry counter 58 (data point 58A; on top of data point 300B) at block 218. As retry counter 58 does not equal or exceed retry limit 54, the result of decision block 220 is "No," and retry timer 56 is reset to zero (data point 56C) at block 222.

During the next cycle, error status trace 300 indicates a normal status (data point 300C). Thus, the algorithm decrements error timer 42 (data point 42C; on top of data point 300C), and retry timer 56 and retry counter 58 remain at their previous levels (56D and 58B, respectively). It is not until the cycle beginning at time 1.0 that error output trace 300 has remained abnormal for the number of cycles needed to cause retry timer 56 to again reach maximum retry time 52. During that cycle, the algorithm reconfigures and re-enables the monitored output, increments retry counter 58 (data point 58C), and re-sets retry timer 56 to zero (data point 56E).

As should be apparent from the foregoing, the algorithm continues in the previously described manner to reconfigure and re-enable the monitored output, increment retry counter 58, and re-set retry timer 56 each time retry timer 56 reaches maximum retry time 52. As error status trace 300 intermittently changes between a normal status and an abnormal status during the first 3.5 time units of FIG. 4B, error timer 42 remains below error timer maximum 44, thereby preventing the algorithm from reporting a constant fault.

Finally, at data point 300D, error status trace 300 indicates an abnormal status under conditions that cause retry counter 58 to reach retry limit 54 (best shown in FIG. 4A). More specifically, after the algorithm increments error timer 42 (data point 42D) at block 210 and compares error timer 42 to error timer maximum 44 at decision block 212, the algorithm determines at decision block 213 whether an intermittent error has been previously identified. In this example, the result of decision block 213 is "No," and the algorithm increments retry timer 56 (data point 56F) at block 214. As retry timer 56 equals maximum retry time 52, the result of decision block 216 is "Yes," and the algorithm reconfigures and re-enables the monitored output signal at block 218. The algorithm also increments retry counter 58 at block 218 as represented by data point 58D in FIG. 4A. Thus, retry counter 58 now equals retry limit 54, and the result of decision block 220 is "Yes." Accordingly, the algorithm identifies an intermittent error type at block 234 and resets retry timer 56 (data point 56G) at block 222.

During the next several cycles, error status trace 300 continues to indicate an abnormal status as the output signal is no longer reconfigured and re-enabled. As a result, the algorithm repeatedly increments error timer 42 at block 210 and compares to error timer maximum 44 at decision block 212. As an intermittent error was previously identified, the result of decision block 213 during these several cycles is "Yes," and the algorithm loops back to block 200.

At data point 42E, error timer 42 reaches error timer maximum 44. Thus, the result of decision block 212 is "Yes," and the algorithm clamps error timer 42 at block 224. As an intermittent error was previously identified, the result of decision block 226 is "Yes," and, depending upon the level of the error, an intermittent high error is set at block 238 or an intermittent low error is set at block 240. The error is then reported to the system in the manner described above.

While this invention has been described as having an exemplary design, the present invention may be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains.

What is claimed is:

1. A method for detecting a fault in an output signal, including the steps of:

determining a status of the output signal;

incrementing an error timer when the output signal status is abnormal;

incrementing a retry timer when the output signal status is abnormal;

incrementing a retry counter when the retry timer reaches a maximum retry time; and reporting an intermittent fault if the retry counter reaches a retry limit before the error timer reaches an error timer maximum.

2. The method of claim 1, further including the step of reporting a constant fault if the error timer reaches the error timer maximum before the retry counter reaches the retry limit.

3. The method of claim 2, further including the step of determining, before the reporting step, whether an intermittent error has been previously identified.

4. The method of claim 1, further including the step of decrementing the error timer when the output signal status is normal.

5. The method of claim 4, wherein the error timer is incremented by a first amount and decremented by a second amount that is different from the first amount.

6. The method of claim 1, further including the step of resetting the retry timer when the retry timer reaches the maximum retry time.

7. The method of claim 1, wherein the incrementing the retry counter step further includes the steps of reconfiguring the output signal with a diagnostic value, and re-enabling the output signal.

8. The method of claim 1, further including the step of permitting the error timer to reach the error timer maximum before performing the reporting step.

9. A computer readable medium having instructions stored thereon for causing a computer to perform a method for detecting faults in an ECM output signal, the method including:
   incrementing an error timer when the output signal has a first status and decrementing the error timer when the output signal has a second status;
   incrementing a retry timer when the output signal has the first status and the error timer is below an error timer maximum;
   incrementing a retry counter when the retry timer reaches a maximum retry time; and
   reporting a first fault type if the retry counter reaches a retry limit before the error timer reaches an error timer maximum.

10. The computer readable medium of claim 9, further including reporting a second fault type if the error timer reaches the error timer maximum before the retry counter reaches the retry limit.

11. The computer readable medium of claim 10, wherein the first fault type corresponds to an intermittent fault condition and the second fault type corresponds to a constant fault condition.

12. The computer readable medium of claim 9, wherein the error timer is incremented by a first amount and decremented by a second amount that is different from the first amount.

13. The computer readable medium of claim 9, wherein the retry timer is reset when the retry timer reaches the maximum retry time.

14. The computer readable medium of claim 13, further including reconfiguring the output signal with a diagnostic value and re-enabling the output signal if the retry timer reaches the maximum retry time.

15. The computer readable medium of claim 9, further including reporting the first fault type after the error timer reaches the error timer maximum.

16. A system for identifying errors in ECM output signals, including:
   an error detection block configured to obtain an actual status of an output signal, the error detection block including logic configured to compare the status to an expected status, and provide a first output if the actual status is different from the expected status and a second output if the actual status is the same as the expected status;
   an error timer block including a summer configured to increment an error timer in response to the first output, decrement the error timer in response to the second output, and provide a timer state signal when the error timer reaches an error timer maximum;
   a retry processor including a retry timer and a retry counter, the retry processor being configured to increment the retry timer in response to the first output, increment the retry counter when the retry timer reaches a maximum retry time, and provide a retry status signal when the retry counter reaches a retry limit; and
   an error identification block coupled to the error timer block and the retry processor, the error identification block being configured to identify a first error type if the error identification block receives the retry status signal before receiving the timer state signal, and a second error type if the error identification block receives the timer state signal before receiving the retry status signal.

17. The system of claim 16, wherein the error identification block initially identifies the first error type after receiving the retry status signal, but before receiving the timer state signal.

18. The system of claim 16, wherein the error timer block is configured to increment the error timer by a first amount and decrement the error timer by a second amount that is different from the first amount.

19. The system of claim 16, wherein the retry processor is configured to reset the retry timer when the retry timer reaches the maximum retry time.

20. The system of claim 16, wherein the retry processor re-enables the output signal each time the retry counter is incremented.

21. The system of claim 20, wherein the retry processor reconfigures the output signal with a diagnostic value before re-enabling the output signal.

22. The system of claim 16, further including a fault output block coupled to the error identification block, the fault output block being configured to report one of an intermittent high fault and an intermittent low fault in response to identification of the first error type, and to report one of a stuck high fault and a stuck low fault in response to identification of the second error type.

23. A system for reporting an intermittent fault in an ECM output signal, including:
   means for determining whether the output signal has an abnormal status;
   means for incrementing an error timer when the output signal has the abnormal status;
   means for controlling a retry timer to initiate a reconfiguration of the output signal if the retry timer reaches a maximum retry time;
   means for incrementing a retry counter if the retry timer reaches the maximum retry time;
   means for outputting a fault signal if the retry counter reaches a retry limit before the error timer reaches an error timer maximum; and
   means for reporting an intermittent fault if the outputting means outputs the fault signal.

24. A method of identifying a fault condition in an output signal, including the steps of:
   periodically detecting whether the output signal is normal or abnormal;
   if the output signal is abnormal, incrementing a timer;
   if the output signal is normal, decrementing a timer;

if the timer reaches a maximum value, indicating a constant fault condition in the output signal.

25. The method of claim 24, wherein the indicating step includes the step of determining whether the timer reaches the maximum value before a counter reaches a predetermined limit.

26. The method of claim 25, further including the step of indicating an intermittent fault if the counter reaches the predetermined limit before the timer reaches the maximum value.

27. The method of claim 24, further including the step of incrementing a retry timer if the output signal is abnormal.

28. The method of claim 27, further including the step of resetting the retry timer if the retry timer reaches a maximum retry time.

29. The method of claim 24, further including the step of periodically reconfiguring the output signal with a diagnostic value.

* * * * *